United States Patent
Niino et al.

(10) Patent No.: US 9,090,820 B2
(45) Date of Patent: Jul. 28, 2015

(54) THERMOPLASTIC RESIN COMPOSITION, PRODUCTION METHOD OF THERMOPLASTIC RESIN COMPOSITION, MOLDING MATERIAL, AND LIGHT-EMITTING BODY

(75) Inventors: Hiroshi Niino, Otake (JP); Yutaka Aoki, Otake (JP)

(73) Assignee: Mitsubishi Rayon Co., Ltd., Tokyo (JP)

( * ) Notice: Subject to any disclaimer, the term of this patent is extended or adjusted under 35 U.S.C. 154(b) by 233 days.

(21) Appl. No.: 13/990,192

(22) PCT Filed: Nov. 28, 2011

(86) PCT No.: PCT/JP2011/077294
§ 371 (c)(1), (2), (4) Date: May 29, 2013

(87) PCT Pub. No.: WO2012/073845
PCT Pub. Date: Jun. 7, 2012

(65) Prior Publication Data
US 2013/0248765 A1  Sep. 26, 2013

(30) Foreign Application Priority Data
Nov. 30, 2010 (JP) .................. 2010-266015

(51) Int. Cl.
*C09K 11/06* (2006.01)
*C08J 3/20* (2006.01)
*C08K 5/00* (2006.01)
*C08K 5/56* (2006.01)
*C08L 101/00* (2006.01)

(52) U.S. Cl.
CPC . *C09K 11/06* (2013.01); *C08J 3/20* (2013.01); *C08K 5/00* (2013.01); *C08K 5/56* (2013.01); *C08L 101/00* (2013.01)

(58) Field of Classification Search
CPC ............. C09K 11/06; C08J 3/20; C08K 5/00; C08K 5/56; C08L 101/00
USPC ..................... 524/398; 252/301.34
See application file for complete search history.

(56) References Cited

FOREIGN PATENT DOCUMENTS

| | | | |
|---|---|---|---|
| CA | 2233976 A | * | 3/1999 |
| JP | 10072552 A | * | 3/1998 |
| JP | 2005-015752 | | 1/2005 |

OTHER PUBLICATIONS

Montes, Ultrafast Energy Transfer in Oligofluorene-Aluminum Bis(8-hydroxyquinoline)acetylacetone Coordination Polymers, J. Am. Chem. Soc., 131, pp. 1787-1795, Jan. 2009.

* cited by examiner

*Primary Examiner* — Michael M Bernshteyn
(74) *Attorney, Agent, or Firm* — Morgan, Lewis & Bockius LLP

(57) ABSTRACT

Disclosed is a production method of a thermoplastic resin composition comprising: blending a thermoplastic resin (A) and a metal complex (B) and a ligand (C2), wherein the metal complex (B) has a ligand (C1) coordinated therein, and wherein the ligand (C2) has a higher boiling point than the ligand (C1) under atmospheric pressure, and then heating and mixing the resulting blend at a temperature of not less than a boiling point of the ligand (C1) and not more than a boiling point of the ligand (C2), to produce a thermoplastic resin composition that can provide a light-emitting body at low cost in which a light-emitting material is dispersed in the resin in a good dispersion state, excellent in transparency and excellent in light-emitting properties of visible light; a molding material obtained by molding the thermoplastic resin composition; and a light-emitting body obtained by molding the thermoplastic resin composition.

7 Claims, No Drawings

THERMOPLASTIC RESIN COMPOSITION, PRODUCTION METHOD OF THERMOPLASTIC RESIN COMPOSITION, MOLDING MATERIAL, AND LIGHT-EMITTING BODY

TECHNICAL FIELD

The present invention relates to a thermoplastic resin composition, a production method of a thermoplastic resin composition, a molding material, and a light-emitting body.

BACKGROUND ART

Metal complexes are useful as light-emitting materials, and used as materials for organic electroluminescent devices and wavelength converting materials for LEDs. However, many of the metal complexes used as light-emitting materials have low solubility in solvents or resins. For this reason, in the case where a metal complex is used as a light-emitting material, the metal complex is used as a thin film of the metal complex formed by a vacuum evaporation method, for example.

In such circumstances, tris(8-hydroxyquinolinato)aluminum (Alq3), which is one of light-emitting materials for organic electroluminescent devices, receives attention for its high quantum yield and high luminance. Alq3 is expected to be applied as a light-emitting body dispersed in a resin or a wavelength converting material for LEDs. Alq3, however, has problems such as low solubility in solvents and low molecule dispersibility into resins.

In order to solve the problems above, Non Patent Literature 1 proposes a method wherein a ligand having two quinolinol skeletons and an aluminum trisacetylacetonate metal complex are subjected to a ligand exchange reaction in an organic solvent to obtain a polymeric metal complex which can be uniformly dispersed in a solvent such as methylene chloride.

CITATION LIST

Non Patent Literature

Non Patent Literature 1: J. AM. CHEM. SOC. 2009, 131, 1787-1795

SUMMARY OF INVENTION

Technical Problem

However, the method proposed in Non Patent Literature 1 has a problem such as high production cost because, to obtain a molded article or a light-emitting body in which the light-emitting material is dispersed in a good dispersion state in a resin, the resin and the light-emitting material need to be once dispersed in a solvent uniformly, and then molding or production of the light-emitting body needs to be performed. Moreover, in the case where the light-emitting material is obtained as a powder, and then dispersed in the resin, dispersibility in the resin is poor, and the quantum yield is low.

An object of the present invention is to provide a thermoplastic resin composition that can provide a light-emitting body at low cost in which a light-emitting material is dispersed in the resin in a good dispersion state, excellent in transparency, and excellent in light-emitting properties of visible light, a production method of a thermoplastic resin composition, a molding material obtained by molding the thermoplastic resin composition, and a light-emitting body obtained by molding the thermoplastic resin composition.

Solution to Problem

The gist of the present invention is, as a first invention, a production method of a thermoplastic resin composition (hereinafter, referred to as the "production method of the present thermoplastic resin composition") comprising: blending a thermoplastic resin (A) and a metal complex (B) and a ligand (C2), wherein the metal complex (B) has a ligand (C1) coordinated therein, and wherein the ligand (C2) has a higher boiling point than the ligand (C1) under atmospheric pressure, and then heating and mixing the resulting blend at a temperature of not less than the boiling point of the ligand (C1) and not more than the boiling point of the ligand (C2). Herein, the "boiling point" designates a boiling point under atmospheric pressure unless otherwise specified.

The gist of the present invention is, as a second invention, a thermoplastic resin composition obtained by the production method of the present thermoplastic resin composition (hereinafter, referred to as the "present thermoplastic resin composition").

Further, the gist of the present invention is, as a third invention, a molding material obtained by molding the present thermoplastic resin composition (hereinafter, referred to as the "present molding material").

Moreover, the gist of the present invention is, as a fourth invention, a light-emitting body obtained by molding the present thermoplastic resin composition or the present molding material (hereinafter, referred to as the "present light-emitting body").

Advantageous Effects of Invention

According to the present invention, a light-emitting body excellent in light-emitting properties of visible light can be obtained at low cost by dispersing a metal complex, which has a low dispersibility in a resin, in the resin in a good dispersion state, and the light ranging from ultraviolet light to visible light having a short wavelength can be converted into longer visible light wavelength. Consequently, the present invention is suitable for utilization in optical material fields and electronic material fields such as solar cells, organic ELs, and liquid crystals.

DESCRIPTION OF EMBODIMENTS

Examples of the thermoplastic resin (A) used in the present invention include acrylic resins, styrene resins, acrylonitrile-styrene copolymers, olefin resins, polycarbonate resins, polyvinyl chloride resins, polyvinylidene chloride resins, polyamide resins, polyester resins, polyacetal resins, polyphenylene ether resins, polyethylene terephthalate resins, polybutylene terephthalate resins, polyarylate resins, polyphenylene sulfide resins, polyethersulfone resins, polyether imide resins, polyether ether ketone resins, polyether ketone resins, and fluorinated resins. These may be used alone or in combination of two or more.

The thermoplastic resin (A) is preferably a thermoplastic resin that is in a molten state at 60 to 300° C. Examples of the thermoplastic resin that is in a molten state at 60 to 300° C. include acrylic resins, styrene resins, acrylonitrile-styrene copolymers, olefin resins, polycarbonate resins, polyvinyl chloride resins, and polyester resins. Among these, acrylic resins, styrene resins, olefin resins, and polycarbonate resins are preferable, and acrylic resins are more preferable from the viewpoint of the light-emitting properties of the light-emitting body to be obtained.

Examples of the acrylic resins include polymethyl methacrylate (PMMA); MMA-based copolymers obtained by copolymerizing methyl methacrylate (MMA) with another monomer, such as styrene, α-methylstyrene, acrylonitrile, acrylate, and methacrylate other than MMA; polymers including a methacrylate unit other than an MMA unit or an acrylate unit as a main component; and acrylic-based graft copolymers obtained by graft copolymerizing a monomer such as (meth)acrylate with a polymer containing a rubber, such as acrylic rubber, silicone rubber, and butadiene rubber, as a main component. These may be used alone or in combination of two or more. In the present invention, "(meth) acrylate" designates "acrylate" or "methacrylate."

Examples of the styrene resins include polystyrene (PS), high impact polystyrene (HIPS), MMA-styrene copolymers (MS), MMA-butadiene-styrene copolymers (MBS), styrene-maleic anhydride copolymers (SMA), styrene-methacrylic acid copolymers (SMAA), styrene-α-methylstyrene copolymers, styrene-maleimide copolymers, acrylonitrile-styrene copolymers, α-methylstyrene-acrylonitrile copolymers, and alloys of the resins above and polyphenylene ether resins. These may be used alone or in combination of two or more.

Examples of the acrylonitrile-styrene copolymers include acrylonitrile-styrene copolymers (SAN), acrylonitrile-styrene-butadiene copolymers (ABS), acrylonitrile-styrene-acrylic rubber copolymers (AAS), acrylonitrile-styrene-chlorinated polyethylene copolymers (ACS), acrylonitrile-styrene-ethylene-propylene rubber copolymers (AES), and acrylonitrile-styrene-ethylene-vinyl acetate copolymers. Examples thereof also include α-methylstyrene-based acrylonitrile copolymers in which a styrene portion in these copolymers is replaced by α-methylstyrene. These may be used alone or in combination of two or more.

Examples of the olefin resin include polyethylene resins such as very low density polyethylene, low density polyethylene, linear low density polyethylene, medium low density polyethylene, and high density polyethylene; ethylene-vinyl acetate copolymers in which a content of a vinyl acetate unit is 0.1 to 25% by mass; ethylene-acrylic acid copolymers in which a content of an acrylic acid unit is 0.1 to 25% by mass; polypropylene; ethylene-propylene block copolymers in which a content of an ethylene unit is 2 to 40% by mass; ethylene-propylene random copolymers in which a content of an ethylene unit is 0.5 to 10% by mass; polybutene; ethylene-propylene rubbers; ethylene-propylene-diene rubbers; and cycloolefin resins (COP). Among these, COP, low density polyethylene, high density polyethylene, and polypropylene are preferable from the viewpoint of excellent mechanical properties of the light-emitting body to be obtained. These may be used alone or in combination of two or more.

Examples of the polycarbonate resins include those obtained by reacting divalent phenol with a carbonylating agent by a method such as interface polycondensation or melt transesterification; those obtained by polymerizing a carbonate prepolymer by a method such as solid phase transesterification; and those obtained by polymerizing a cyclic carbonate compound by ring-opening polymerization. These may be used alone or in combination of two or more. Examples of divalent phenol include hydroquinone, 4,4'-dihydroxydiphenyl, bis(4-hydroxyphenyl)methane, bis{(4-hydroxy-3,5-dimethyl)phenyl}methane, 1,1-bis(4-hydroxyphenyl)ethane, 1,1-bis(4-hydroxyphenyl)-1-phenylethane, and 2,2-bis(4-hydroxyphenyl)propane (known as bisphenol A). Examples of the carbonylating agent include carbonyl halides such as phosgene, carbonate esters such as diphenyl carbonate, and haloformates such as dihaloformate of divalent phenol.

Examples of the polyvinyl chloride resins include polyvinyl chloride; vinyl chloride copolymers obtained by copolymerizing vinyl chloride with another monomer such as ethylene, propylene, acrylonitrile, vinylidene chloride, and vinyl acetate; and modified polyvinyl chloride resins in which MBS, ABS, nitrile rubber, chlorinated polyethylene, an ethylene vinyl alcohol-vinyl chloride graft copolymer, a variety of plasticizers or the like are added to the polyvinyl chloride resins above. These may be used alone or in combination of two or more.

In the present invention, the ligand (C1) is coordinated in the metal complex (B) described later. The ligand (C1) is preferably a ligand having a boiling point of 60 to 200° C. from the viewpoint of easy removal after release from the metal complex (B) by ligand exchange. The ligand (C1) including no aromatic ring is more preferable from the viewpoint of excellent dispersibility in the thermoplastic resin (A).

Examples of the ligand (C1) having a boiling point of 60 to 200° C. include β-diketone compounds such as acetylacetone (boiling point of 140° C.), trifluoroacetylacetone (boiling point of 105° C.), and hexafluoroacetylacetone (boiling point of 70° C.); alcohols such as methanol (boiling point of 65° C.), ethanol (boiling point of 78° C.), propanol (boiling point of 97° C.), isopropanol (boiling point of 82° C.), and butanol (boiling point of 117° C.); carboxylic acids such as formic acid (boiling point of 100° C.), acetic acid (boiling point of 117° C.), and propionic acid (boiling point of 141° C.); and acetoacetic acid esters such as methyl acetoacetate (boiling point of 170° C.), and ethyl acetoacetate (boiling point of 180° C.). These may be used alone or in combination of two or more. Among these, acetylacetone, ethyl acetoacetate, and isopropanol are preferable from the viewpoint of the dispersibility of the metal complex (B) in the resin and easy removal after release.

In the metal complex (B) used in the present invention, the ligand (C1) described above is coordinated with a metal. Examples of the metal in the metal complex (B) include elements in Group 1 excluding hydrogen, Group 2, Group 3 including lanthanoids and actinoids, Group 4, Group 5, Group 6, Group 7, Group 8, Group 9, Group 10, Group 11, Group 12, Group 13 excluding boron, Group 14 excluding carbon, Group 15 excluding nitrogen, phosphorus, and arsenic, and Group 16 excluding oxygen, sulfur, selenium, and tellurium in the periodic table.

Specific examples of the metals in the metal complex (B) include Li, Na, K, Rb, Cs, Be, Mg, Ca, Sr, Ba, Sc, Y, La, Ce, Pr, Nd, Pm, Sm, Eu, Gd, Tb, Dy, Ho, Er, Tm, Yb, Lu, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, Hg, Al, Ga, In, Tl, Si, Ge, Sn, Pb, Sb, and Bi. These metals can be properly selected according to the light emission color of the present light-emitting body described later. These metals may be used alone or in combination of two or more. Among these metals, Be, Mg, Zn, Al, Cu, Pt, Eu, Ga, In, Co, and Ir are preferable, and Al and Zn are more preferable from the viewpoint of the light-emitting properties of the present light-emitting body.

Examples of the metal complex (B) include aluminum acetylacetonate (melting point: 195° C.), aluminum isopropoxide (melting point: 131° C.), aluminum ethoxide (melting point: 140° C.), ethyl acetoacetate aluminum diisopropoxide (liquid at room temperature), aluminum tris(ethyl acetoacetate) (melting point: 75° C.), zinc acetylacetonate (melting point: 138° C.), zinc acetate (melting point: 237° C.), magnesium diethoxide (melting point: 270° C.), cobalt(II) acetylacetonate (melting point: 170° C.), cobalt(III) acetylacetonate (melting point: 210° C.), copper(II) acetylacetonate (melting point: 288° C.), tris(acetylacetonate)indium(III) (melting point: 189° C.), iridium acetylacetonate (melting point: 271° C.), gallium acetylacetonate (melting point: 198° C.), europium acetylacetonate (melting point: 140° C.), and platinum acetylacetonate (melting point: 252° C.). Considering dispersibility in the resin, the central metal preferably has a valency of 2 or more. Further, at a valency of the central metal of 3 or more, the metal complex has a stereostructure, leading to weak aggregation of metal complexes. Additionally, the central metal is easily surrounded by the ligand, leading to less water coordination. As a result, dispersibility in the resin is enhanced. For this reason, the central metal in the metal complex (B) more preferably has a valency of 3 or more. The metal complexes (B) may be used alone or in combination of two or more.

The ligand (C2) used in the present invention is a ligand having a boiling point higher than that of the ligand (C1). Particularly, the ligand having a boiling point 30° C. or more higher than the boiling point of the ligand (C1) is preferable. Moreover, the ligand (C2) is preferably the ligand having one or two functional groups that can form a chemical bond with the metal, and one or two unshared electron pairs that can be physically interactive with the metal, in the ligand molecule. Here, the chemical bond with the metal means a bond chemically formed between the metal and an element in the molecule. Examples of functional groups that can form a chemical bond with the metal include a hydroxyl group, a carboxylic acid group, an amino group, an acetylacetonate (keto-enol tautomeric) group, and a thiol group. Examples of the structure having the unshared electron pair(s) that can be physically interactive with the metal include those having a nitrogen atom, ether oxygen in tetrahydrofuran or the like, a nitrile group, a carbonyl group, nitrogen in imidazole not bonded to hydrogen, a sulfonyl group, a nitro group, or a nitroso group.

The temperature in the heating and mixing is set at a temperature higher than the boiling point of the ligand (C1) and not more than the boiling point of the ligand (C2). Thereby, the ligand (C1) in the metal complex (B) is subjected to ligand exchange for the ligand (C2). Additionally, the released ligand (C1) can be easily discharged to the outside of the system, and the ligand exchange reaction can be accelerated. For this reason, the ligand (C2) preferably has the boiling point under atmospheric air 30° C. or more higher than the boiling point under atmospheric air of the ligand (C1). Moreover, the ligand (C2) is preferably a ligand having one or two functional groups that can form a chemical bond with the metal in the chemical structure of the ligand (C2), and one or two unshared electron pairs that can be physically interactive with the metal because crosslinking of metal complexes with the ligand (C2) can be suppressed in the ligand exchange, providing good dispersibility in the resin.

Examples of the ligand (C2) include 2-quinolinol, 3-quinolinol, 4-quinolinol, 5-quinolinol, 6-quinolinol, 7-quinolinol, 8-quinolinol (boiling point of 267° C.), 2-alkyl-8-quinolinol, 3-alkyl-8-quinolinol, 4-alkyl-8-quinolinol, 5-alkyl-8-quinolinol, 6-alkyl-8-quinolinol, and 7-alkyl-8-quinolinol (alkyl group is a linear or branched hydrocarbon group having 1 to 4 carbon atoms (all have a boiling point of 200 to 267° C.)), dibenzoyl methane (boiling point of 357° C.), 4,4,4-trifluoro-1-(2-thienyl)-1,3-butanedione (boiling point of 104° C./9 mmHg, boiling point under atmospheric pressure of 240° C.), 1-phenyl-1,3-butanedione (boiling point of 262° C.), 2,2,6,6-tetramethyl-3,5-heptadione (boiling point of 80° C./12 mmHg, boiling point under atmospheric pressure of 200° C.), and 2-(2-hydroxyphenyl)benzooxazole (boiling point of 338° C.). These may be used alone or in combination of two or more. For example, 8-quinolinol has one chemical bond with metal formed by the reaction between an OH group and the metal, and one physical interaction of a nitrogen atom via the unshared electron pair. The ligand (C2) is preferably a compound other than polyalkylene glycol.

From the viewpoint of the light-emitting properties of the light-emitting body, the ligand (C2) is a ligand having a boiling point of preferably not less than 200° C., and is a ligand having a boiling point of particularly preferably not less than 200° C. and not more than 500° C. such as 8-quinolinol, 2-alkyl-8-quinolinol, and 2-(2-hydroxyphenyl)benzooxazole, and 8-quinolinol and 2-alkyl-8-quinolinol are more preferable.

The present thermoplastic resin composition is a thermoplastic resin composition obtained by blending a thermoplastic resin (A) and a metal complex (B) and a ligand (C2), wherein the metal complex (B) has a ligand (C1) coordinated therein, and wherein the ligand (C2) has a higher boiling point than the ligand (C1) under atmospheric pressure, and then heating and mixing the resulting blend at a temperature of not less than the boiling point of the ligand (C1) and not more than the boiling point of the ligand (C2).

The blending amount of the metal complex (B) in the present thermoplastic resin composition is preferably 0.001 to 30 parts by mass, more preferably 0.005 to 10 parts by mass, and particularly preferably 0.01 to 10 parts by mass based on 100 parts by mass of the thermoplastic resin (A). If a blending amount of the metal complex (B) is 0.001 parts by mass or more, the light-emitting body to be obtained is excellent in light emission strength. If the blending amount of the metal complex (B) is 30 parts by mass or less, the ligand (C1) or a decomposition gas derived from the ligand (C1), generated by the ligand exchange of the metal complex (B) during the heating and mixing, is easily treated. The blending amount of the metal in the present thermoplastic resin composition is preferably 10 to 20000 ppm (parts by mass, hereinafter, also simply referred to as ppm), and more preferably 100 to 5000 ppm based on 100 parts by mass of the thermoplastic resin (A) from the viewpoint of the transparency and light-emitting properties of the light-emitting body to be obtained by molding the thermoplastic resin composition.

The blending amount of the ligand (C2) in the present thermoplastic resin composition is preferably 0.0001 to 1,000 parts by mass, more preferably 0.01 to 100 parts by mass, and particularly preferably 0.1 to 30 parts by mass based on 100 parts by mass of the thermoplastic resin (A). If the blending amount of the ligand (C2) is 0.0001 parts by mass or more, the light-emitting body to be obtained is excellent in light-emitting properties. If the blending amount of the ligand (C2) is 1,000 parts by mass or less, the light-emitting body to be obtained is excellent in transparency and light-emitting properties.

The largest blending amount $w_{C2}$ of the ligand (C2) in the present thermoplastic resin composition (parts by mass based on 100 parts by mass of the thermoplastic resin) can be expressed by the following equation (1) using molecular weight $M_{C2}$ of the ligand (C2), the molecular weight $M_B$ of the metal complex (B), the largest coordination number n of the metal complex (B), and the blending amount $w_B$ of the metal complex (B):

$$w_{C2} = w_B/M_B \times n \times M_{C2} \tag{1}$$

The blending amount of the ligand (C2) is preferably twice or less than the largest blending amount $w_{c2}$ because the exchange of the ligand (C1) in the metal complex (B) can be accelerated sufficiently, and the unreacted ligand (C2) can be easily discharged to the outside of the system.

The temperature in heating and mixing the thermoplastic resin (A), the metal complex (B), and the ligand (C2) is a temperature of not less than the boiling point of the ligand (C1) and not more than the boiling point of the ligand (C2). Even if the heating and mixing temperature is a temperature not more than the melting point of the metal complex (B), the metal complex (B) may be dispersed in the thermoplastic resin (A) at the heating and mixing temperature. In the case where the metal complex (B) is difficult to disperse in the thermoplastic resin (A), heating and mixing is preferably performed at a temperature of the melting point of the metal complex (B) or more.

For example, when PMMA as the thermoplastic resin (A), aluminum acetylacetonate (melting point: 195° C.) as the metal complex (B) in which the ligand (C1) is acetylacetone (boiling point of 140° C.), and 8-quinolinol as the ligand (C2) (boiling point of 126° C./10 mmHg (equivalent to 267° C.)) are used, the heating and mixing temperature is not less than 140° C. which is the boiling point of acetylacetone as the ligand (C1). PMMA as the thermoplastic resin (A) is preferably kneaded at a temperature of not less than 200° C. For this reason, the heating and mixing temperature above is preferably not less than 200° C.

Further, 8-quinolinol as the ligand (C2) has the boiling point of 126° C./10 mmHg (boiling point under atmospheric pressure: 267° C.), and the heating and mixing temperature is set at 140 to 267° C. The heating and mixing temperature for the thermoplastic resin (A), the metal complex (B), and the ligand (C2) is preferably set at 140 to 267° C. because the ligand (C2) will not vaporize and will be in the mixture during the heating and mixing, and can contribute the exchange reaction of the ligand (C1) in the metal complex (B).

In the present invention, when necessary, after the thermoplastic resin (A), the metal complex (B), and the ligand (C2) are heated and mixed, the temperature can be further raised to a temperature of not less than the boiling point of the ligand (C2) to perform the heating and mixing again. Thereby, the unreacted ligand (C2) can be discharged to the outside of the system.

In the present invention, to accelerate the reaction by efficiently discharging the ligand (C1) separated during heating and mixing of the thermoplastic resin (A), the metal complex (B), and the ligand (C2) to the outside of the system, the heating and mixing of the thermoplastic resin (A), the metal complex (B), and the ligand (C2) can be performed under reduced pressure.

The heating and mixing time for the thermoplastic resin (A), the metal complex (B), and the ligand (C2) can be properly set according to the molten state of the thermoplastic resin (A), and the reaction state of the ligand (C2) and the metal complex (B). The heating and mixing time is preferably 0.5 to 60 minutes. A heating and mixing time of 0.5 minutes or more accelerates exchange of the ligand in the metal complex (B), attaining good light emission strength of the present light-emitting body. A heating and mixing time of 60 minutes or less can suppress decomposition of the thermoplastic resin (A) not to impair the properties intrinsic to the thermoplastic resin (A).

Examples of mixing apparatuses for heating and mixing the thermoplastic resin (A), the metal complex (B), and the ligand (C2) include a single screw extruder, a multi-screw extruder having two or more screws, a Banbury mixer, a kneader, and a roll. Among these mixing apparatuses, the single screw extruder and the multi-screw extruder having two or more screws are preferable from the viewpoint of good dispersibility of the reaction product of the metal complex (B) and the ligand (C2) in the molding material and the light-emitting body and from the viewpoint of excellent light emission strength of the light-emitting body to be obtained.

Examples of a method of heating and mixing the thermoplastic resin (A), the metal complex (B), and the ligand (C2) when an extruder is used as the mixing apparatus, include a method in which the thermoplastic resin (A), the metal complex (B), and the ligand (C2) are fed into the extruder from a raw material feeding hopper upstream side thereof and mixed; and a method in which the thermoplastic resin (A) is fed from a raw material feeding hopper, and heated and molten, and the metal complex (B) and the ligand (C2), or the metal complex (B) and ligand (C2) diluted with an organic solvent are injected from some midpoint of the extruder, and mixed.

The present molding material is obtained by molding the present thermoplastic resin composition. Examples of forms of the present molding material include pellet-like products, foamed beads, film-like or sheet-like products, and foamed film-like or sheet-like products.

To obtain the pellet-like product, a known mixing apparatus can be used as the mixing apparatus, for example. Examples of a pelletizing method include a method in which using a single screw extruder or a multi-screw extruder having two or more screws, a Banbury mixer, a kneader, a roll, or the like, a strand-like product discharged from the mixing apparatus is cut into strip shape to be pelletized.

Examples of a method for obtaining a film-like or sheet-like product include a (co)extrusion method, a press method, and a casting method.

The present light-emitting body is obtained by molding the present thermoplastic resin composition or the present molding material. Examples of a molding method for obtaining the present light-emitting body include injection molding, extrusion molding, blow molding, inflation molding, vacuum molding, compression molding, and foaming molding.

For excellent light-emitting properties of the present light-emitting body, practically sufficient light emission is obtained even in use of excitation light source having low energy such as black light.

Examples of the black light usable as the excitation light source for the present light-emitting body include the black light having a peak wavelength in the vicinity of the wavelength of 350 nm. The visible light having a peak in the vicinity of the wavelength 400 nm can also be used as the excitation light source usable for the present light-emitting body.

EXAMPLES

Hereinafter, the present invention will be described using Examples. In the following, "parts" and "%" designate "parts by mass" and "% by mass," respectively. The transmittance and quantum yield of the light-emitting body obtained were measured according to the methods shown below.

(1) Transmittance

The transmittance of a test piece of the light-emitting body obtained was measured at wavelengths of 400 nm, 600 nm, and 800 nm using a spectrophotometer (made by Hitachi, Ltd., trade name: U-3300). The transmittance was used as an index of the dispersibility of the metal complex (B) in the thermoplastic resin (A) in the light-emitting body.

(2) Light Emission Color, Internal Quantum Yield, and Peak Wavelength

The surface of a test piece of the light-emitting body obtained (10 mm×20 mm) was set within an integrating sphere in an absolute quantum yield measurement apparatus (made by Otsuka Electronics Co., Ltd., trade name: PE-1100), and the light emission spectrum in use of the excitation light at an excitation wavelength of 365 nm was measured. From the obtained data, the light emission color and the peak wavelength of the light emission color were specified. The internal quantum yield was calculated, which is a value obtained by dividing the number of photons emitted from the light-emitting body by the number of photons absorbed in the light-emitting body in the irradiated excitation light. The internal quantum yield was used as an index of the light-emitting properties.

Synthesis Example 1

30 mL of a toluene solution of 3.19 g of 8-quinolinol (22 mmol) was dropped into 6.66 mL of a toluene solution of 15% triethylaluminum (7.3 mmol of triethylaluminum) under stirring at room temperature over 1 hour to obtain a toluene dispersion liquid of tris(8-hydroxyquinolinato)aluminum (Alq3). The obtained toluene dispersion liquid of Alq3 was left overnight as it was under room temperature. Then, the precipitated solid was filtered. Next, the obtained filtrate was condensed under reduced pressure to obtain a deposited powder; the powder was washed with a small amount of toluene, and dried to obtain 2.8 g of a powder of Alq3 (yield of 88%).

Synthesis Example 2

A cooling tube and a stirrer were set in a 100 ml eggplant flask. 2.8 g (11 mmol) of zinc acetylacetonate (made by Tokyo Chemical Industry Co., Ltd.), 50 mL of dimethylformamide, and 3.19 g (22 mmol) of 8-quinolinol were placed in the flask to obtain a dimethylformamide dispersion liquid of bis(8-hydroxyquinolinato)zinc(II) (Znq2). The dispersion liquid was dropped into 1000 ml of water little by little. The deposited solid was filtered, and recovered. The recovered solid was washed with a small amount of methanol, and dried to obtain 2.5 g of a powder of Znq2 (yield of 64%).

Example 1

100 parts of polymethyl methacrylate as the thermoplastic resin (A) (made by MITSUBISHI RAYON CO., LTD., trade name: VHK), 0.25 parts of aluminum acetylacetonate as the metal complex (B) (made by Tokyo Chemical Industry Co., Ltd.) (the content of the metal in the resin was 208 ppm), and 0.34 parts of 8-quinolinol as the ligand (C2) (made by KANTO CHEMICAL CO., INC.) were charged into a compact injection molding machine (made by Custom Scientific Instruments Inc., trade name: CS-183 MMX), and mixed at a temperature of 250° C. for 5 minutes to obtain a pellet.

The obtained pellet was dissolved in deuterochloroform such that the concentration was 5%. The solution was measured using a $^1$H-NMR measurement apparatus (made by JEOL, Ltd., trade name: JNM-EX270). The peaks of protons derived from the quinolinol skeleton bonded to aluminum were observed at 7.2 to 9.0 ppm. The peak of protons derived from the acetylacetonate skeleton bonded to aluminum was observed at 5.5 ppm. As above, it was confirmed that aluminum acetylacetonate was subjected to the ligand exchange for 8-quinolinol in the obtained pellet. In the pellet, a mixture of aluminum acetylacetonate, tris(8-hydroxyquinolinato)aluminum, bis(8-hydroxyquinolinato)acetylacetonate aluminum, and bis(acetylacetonate)-8-hydroxyquinolinato aluminum was found.

The obtained pellet was charged into the compact injection molding machine above again, and kneaded at a temperature of 250° C. for 1 minute. Then, the kneaded product was molded using the compact injection molding machine to obtain a test piece of the light-emitting body measuring 10 mm×20 mm×2 mm. The surface of the obtained test piece was mirror polished using a polisher (made by Marumoto Kogyo K.K., type: 5629) to obtain a test piece of the light-emitting body measuring 10 mm×20 mm×1.5 mm. The results of evaluation are shown in Table 1.

Examples 2 to 15

A test piece of the light-emitting body was obtained in the same manner as in Example 1 except that the kinds of the thermoplastic resin (A), the metal complex (B), and the ligand (C2), the blending amounts thereof, the heating and mixing temperature, and the heating and mixing time were changed as shown in Table 1. The results of evaluation are shown in Table 1.

Comparative Example 1

A test piece of the light-emitting body was obtained in the same manner as in Example 1 except that 0.35 parts of Alq3 as the metal complex (B) (the content of the metal in the resin was 208 ppm) was used, and no ligand (C2) was used. The results of evaluation are shown in Table 2.

Comparative Examples 2 to 9

A test piece of the light-emitting body was obtained in the same manner as in Comparative Example 1 except that the kind of the metal complex (B), the blending amount thereof, the heating and mixing temperature, and the heating and mixing time were changed as shown in Table 2. The results of evaluation are shown in Table 2.

TABLE 1

| | | Example 1 | Example 2 | Example 3 | Example 4 | Example 5 | Example 6 | Example 7 | Example 8 |
|---|---|---|---|---|---|---|---|---|---|
| Thermoplastic Resin (A) | Kind | PMMA | PMMA | PMMA | PMMA | PMMA | PMMA | PMMA | PMMA |
| | [Parts] | 100 | 100 | 100 | 100 | 100 | 100 | 100 | 100 |
| Metal Complex (B) | Kind | B-1 | B-1 | B-1 | B-1 | B-1 | B-1 | B-1 | B-2 |
| | [Parts] | 0.25 | 2.0 | 4.0 | 0.25 | 0.5 | 0.5 | 0.5 | 0.007 |
| Ligand (C2) | Kind | C2-1 | C2-1 | C2-1 | C2-1 | C2-1 | C2-1 | C2-1 | C2-1 |
| | [Parts] | 0.34 | 3.4 | 6.8 | 0.34 | 0.23 | 0.46 | 0.68 | 0.0078 |
| Metal Content [ppm] | | 208 | 1667 | 3333 | 208 | 417 | 417 | 417 | 17 |
| Heating and Mixing Temperature [° C.] | | 250 | 250 | 250 | 220 | 220 | 220 | 220 | 250 |

TABLE 1-continued

|  |  |  |  |  |  |  |  |  |
|---|---|---|---|---|---|---|---|---|
| Heating and Mixing Time [min] | 5 | 5 | 5 | 3 | 3 | 3 | 3 | 5 |
| Molding Temperature [° C.] | 250 | 250 | 250 | 220 | 220 | 220 | 220 | 250 |
| Transmittance [%] 400 nm | 0 | 0 | 0 | 0 | 0 | 0 | 0 | 83 |
| 600 nm | 90 | 39 | 31 | 89 | 91 | 91 | 90 | 90 |
| 800 nm | 92 | 41 | 36 | 90 | 91 | 90 | 90 | 91 |
| Light Emission Color | Green | Green | Green | Green | Green | Green | Green | Green |
| Internal Quantum Yield [%] | 39 | 36 | 32 | 39 | 43 | 40 | 38 | 4 |
| Peak Wavelength [nm] | 513 | 513 | 513 | 512 | 511 | 512 | 513 | 500 |

|  |  | Example 9 | Example 10 | Example 11 | Example 12 | Example 13 | Example 14 | Example 15 |
|---|---|---|---|---|---|---|---|---|
| Thermoplastic Resin (A) | Kind | PMMA | PMMA | PMMA | MS | MS | PS | PS |
|  | [Parts] | 100 | 100 | 100 | 100 | 100 | 100 | 100 |
| Metal Complex (B) | Kind | B-2 | B-2 | B-2 | B-1 | B-3 | B-2 | B-3 |
|  | [Parts] | 0.056 | 0.28 | 0.56 | 0.5 | 0.5 | 0.5 | 0.5 |
| Ligand (C2) | Kind | C2-1 | C2-1 | C2-1 | C2-1 | C2-2 | C2-1 | C2-1 |
|  | [Parts] | 0.062 | 0.31 | 0.62 | 0.68 | 0.88 | 0.63 | 0.68 |
| Metal Content [ppm] |  | 138 | 690 | 1380 | 417 | 493 | 1233 | 493 |
| Heating and Mixing Temperature [° C.] |  | 250 | 250 | 250 | 220 | 220 | 220 | 220 |
| Heating and Mixing Time [min] |  | 5 | 5 | 5 | 3 | 3 | 3 | 3 |
| Molding Temperature [° C.] |  | 250 | 250 | 250 | 220 | 220 | 220 | 220 |
| Transmittance [%] | 400 nm | 14 | 0 | 0 | 0 | 0 | 0 | 0 |
|  | 600 nm | 79 | 48 | 16 | 86 | 87 | 85 | 85 |
|  | 800 nm | 83 | 62 | 27 | 89 | 89 | 87 | 87 |
| Light Emission Color |  | Yellow | Yellow | Yellow | Green | Light blue | Yellow | Green |
| Internal Quantum Yield [%] |  | 16 | 16 | 16 | 26 | 28 | 23 | 31 |
| Peak Wavelength [nm] |  | 540 | 540 | 540 | 516 | 493 | 537 | 522 |

TABLE 2

|  |  | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 |
|---|---|---|---|---|---|---|---|---|---|---|
| Thermoplastic Resin (A) | Kind | PMMA | PMMA | PMMA | PMMA | PMMA | PMMA | PMMA | PMMA | PMMA |
|  | [Parts] | 100 | 100 | 100 | 100 | 100 | 100 | 100 | 100 | 100 |
| Metal Complex (B) | Kind | Alq3 | Alq3 | Alq3 | Alq3 | Alq3 | Znq2 | Znq2 | Znq2 | Znq2 |
|  | [Parts] | 0.35 | 2.84 | 5.67 | 0.35 | 0.71 | 0.0094 | 0.0751 | 0.3757 | 0.7514 |
| Ligand (C2) | Kind | — | — | — | — | — | — | — | — | — |
|  | [Parts] | — | — | — | — | — | — | — | — | — |
| Metal Content [ppm] |  | 208 | 1667 | 3333 | 208 | 417 | 17 | 138 | 690 | 1380 |
| Heating and Mixing temperature [° C.] |  | 250 | 250 | 250 | 220 | 220 | 250 | 250 | 250 | 250 |
| Heating and Mixing Time [min] |  | 5 | 5 | 5 | 3 | 3 | 5 | 5 | 5 | 5 |
| Molding Temperature [° C.] |  | 250 | 250 | 250 | 220 | 220 | 250 | 250 | 250 | 250 |
| Transmittance [%] | 400 nm | 0 | 0 | 0 | 0 | 0 | 82 | 10 | 0 | 0 |
|  | 600 nm | 82 | 3 | 1 | 84 | 30 | 88 | 74 | 39 | 14 |
|  | 800 nm | 84 | 10 | 4 | 85 | 45 | 90 | 80 | 60 | 23 |
| Light Emission Color |  | Green | Green | Green | Green | Green | Green | Yellow | Yellow | Yellow |
| Internal Quantum Yield [%] |  | 31 | 31 | 31 | 31 | 31 | 3 | 17 | 19 | 16 |
| Peak Wavelength [nm] |  | 513 | 518 | 519 | 515 | 519 | 500 | 525 | 538 | 542 |

Abbreviations described in Tables 1 and 2 designate compounds below, respectively.

PMMA: polymethyl methacrylate (trade name: VHK, made by MITSUBISHI RAYON CO., LTD.)

MS: methyl methacrylate-styrene copolymer (trade name: BR-52, made by MITSUBISHI RAYON CO., LTD.)

PS: polystyrene (trade name: TOYO STYROL G200C, made by TOYO STYRENE Co., Ltd.)

B-1: aluminum acetylacetonate (made by Tokyo Chemical Industry Co., Ltd.) [ligand acetylacetone has a boiling point of 140° C.]

B-2: zinc acetylacetonate (made by Tokyo Chemical Industry Co., Ltd.) [ligand acetylacetone has a boiling point of 140° C.]

B-3: aluminum ethylacetoacetate diisopropoxide (trade name: ALCH, made by Kawaken Fine Chemicals Co., Ltd.) [ligand ethyl acetoacetate has a boiling point of 180° C.]

C2-1: 8-quinolinol (made by KANTO CHEMICAL CO., INC., boiling point of 267° C.)

C2-2: 2-methyl-8-quinolinol (made by Tokyo Chemical Industry Co., Ltd., boiling point of 267° C.)

It becomes apparent that, at the same content of the metal, the light-emitting bodies obtained in Examples 1 to 11 have higher transmittance and internal quantum yield of the light-emitting bodies than those of the light-emitting bodies obtained in Comparative Examples 1 to 9, that is, the light-emitting bodies obtained by blending only the metal complex with the thermoplastic resin, and extruding and molding the blend, and that, conversion into a good light emission color is performed even in use of visible light having a wavelength of 400 nm as a light source.

The invention claimed is:

1. A production method of a thermoplastic resin composition,
    blending a thermoplastic resin (A) and a metal complex (B) and a ligand (C2), wherein the metal complex (B) has a ligand (C1) coordinated therein, and wherein the ligand (C2) has a higher boiling point than the ligand (C1) under atmospheric pressure,
    and then heating and mixing the resulting blend at a temperature of not less than the boiling point of the ligand (C1) and not more than the boiling point of the ligand (C2).

2. The production method of a thermoplastic resin composition according to claim 1, wherein the ligand (C2) has one or two functional groups that can form a chemical bond with a metal, and one or two unshared electron pairs that are physically interactive with the metal, in the ligand molecule.

3. The production method of a thermoplastic resin composition according to claim 1, wherein the ligand (C2) is a compound other than polyalkylene glycol.

4. The production method of a thermoplastic resin composition according to claim 1, wherein the ligand (C1) has a boiling point under atmospheric pressure of 60 to 200° C.

5. The production method of a thermoplastic resin composition according to claim 1, wherein the boiling point under atmospheric pressure of ligand (C2) is higher than the boiling point under atmospheric pressure of the ligand (C1), and the difference is 30° C. or more.

6. The production method of a thermoplastic resin composition according to claim 1, wherein the ligand (C2) has a boiling point under atmospheric pressure of not less than 200° C.

7. The production method of a thermoplastic resin composition according to claim 1, wherein a central metal of the metal complex (B) is at least one selected from the group consisting of Be, Mg, Zn, Al, Cu, Pt, Eu, Ga, In, Co, and Ir.

* * * * *